United States Patent
Shan et al.

(10) Patent No.: US 9,507,187 B2
(45) Date of Patent: Nov. 29, 2016

(54) METHOD FOR DETECTING THE BRIGHT POINT IN THE LIQUID CRYSTAL DISPLAY PANEL

(71) Applicant: BEIJING BOE OPTOELECTRONICS TECHNOLOGY CO., LTD., Beijing (CN)

(72) Inventors: Qingzeng Shan, Beijing (CN); Hao Sun, Beijing (CN)

(73) Assignee: BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/055,228

(22) Filed: Oct. 16, 2013

(65) Prior Publication Data

US 2014/0104526 A1    Apr. 17, 2014

(30) Foreign Application Priority Data

Oct. 17, 2012   (CN) .......................... 2012 1 0395011

(51) Int. Cl.
| | |
|---|---|
| *G01R 31/26* | (2014.01) |
| *G02F 1/133* | (2006.01) |
| *G09G 3/00* | (2006.01) |
| *G09G 3/36* | (2006.01) |
| *G09G 1/00* | (2006.01) |

(52) U.S. Cl.
CPC .......... *G02F 1/13306* (2013.01); *G09G 3/006* (2013.01); *G09G 3/3648* (2013.01); *G09G 1/00* (2013.01); *G09G 2230/00* (2013.01); *H01L 2223/00* (2013.01)

(58) Field of Classification Search
CPC ............... G09G 1/00; G09G 2230/00; G09G 2290/00; H01L 21/00; H01L 2221/00; H01L 2223/00; H01L 2924/00; H01L 2925/00
USPC ...................................... 324/760.01
See application file for complete search history.

(56) References Cited

U.S. PATENT DOCUMENTS

| | | | |
|---|---|---|---|
| 5,432,461 A | 7/1995 | Henley | |
| 5,982,190 A | 11/1999 | Toro-Lira | |
| 6,111,424 A * | 8/2000 | Bosacchi | G09G 3/006 |
| | | | 324/750.11 |

(Continued)

FOREIGN PATENT DOCUMENTS

| | | |
|---|---|---|
| CN | 1666242 A | 9/2005 |
| CN | 102144307 A | 8/2011 |

OTHER PUBLICATIONS

Extended European Search Report dated Jan. 31, 2014; Appln. No. 13188918.0-1904.

(Continued)

*Primary Examiner* — Jermele M Hollington
*Assistant Examiner* — Temilade Rhodes-Vivour
(74) *Attorney, Agent, or Firm* — Ladas & Parry LLP

(57) ABSTRACT

The embodiment of the present invention discloses a method for detecting the bright point in the liquid crystal display panel. The method comprises applying a cutoff voltage to a gate, remaining a thin film transistor TFT switch turning-off, applying a voltage higher than the voltage of a common electrode to a data line, and detecting a bright point under a black image based on the voltages applied to the gate and the data line. The present invention realizes the bright point detecting under a black image.

4 Claims, 2 Drawing Sheets

(56) References Cited

U.S. PATENT DOCUMENTS

| | | | |
|---|---|---|---|
| 6,750,926 B2* | 6/2004 | Ohgiichi | G02F 1/1345 324/760.01 |
| 7,636,148 B2* | 12/2009 | Yoo | G02F 1/136259 349/192 |
| 2005/0168491 A1* | 8/2005 | Takahara et al. | 345/690 |
| 2005/0275770 A1* | 12/2005 | Kubota | G02F 1/1337 349/110 |
| 2007/0046318 A1* | 3/2007 | Kang | G02F 1/1303 324/750.26 |
| 2007/0046321 A1* | 3/2007 | Kang | G02F 1/1309 324/760.01 |
| 2007/0114530 A1* | 5/2007 | Kimura | G09G 3/3225 257/59 |
| 2008/0036930 A1* | 2/2008 | Konno et al. | 349/33 |
| 2008/0084365 A1 | 4/2008 | Takahara et al. | |
| 2010/0238386 A1* | 9/2010 | Yin et al. | 349/106 |
| 2011/0199787 A1* | 8/2011 | Kim | G02B 6/0023 362/612 |
| 2012/0012854 A1* | 1/2012 | Kaneko | G02F 1/136213 257/72 |
| 2015/0198762 A1 | 7/2015 | Kim et al. | |

OTHER PUBLICATIONS

First Chinese Office Action dated Oct. 28, 2015; Appln. No. 201210395011.5.
Second Chinese Office Action dated Jun. 20, 2016; Appln. No. 201210395011.5.

* cited by examiner

METHOD FOR DETECTING THE BRIGHT POINT IN THE LIQUID CRYSTAL DISPLAY PANEL

TECHNICAL FIELD

The embodiment of the present invention relates to a method for detecting the bright point in a liquid crystal display panel.

BACKGROUND

Nowadays, for a liquid crystal display panel in a normally black mode, the bright point cannot be effectively detected when the liquid crystal display panel displays the black image. As shown in FIG. 1, the signal characteristics of the existing black detecting screen are applying a higher voltage to the gate electrode (Gate) of the detected liquid crystal display panel to turn on the thin film transistor (TFT) switch of the detected liquid crystal display panel; applying a lower voltage (which is equal to the voltage on the common electrode (Common) of the detected liquid crystal display panel) to the data line (Data) of the detected liquid crystal display panel. At this time, the image of the liquid crystal display panel is black. Generally, during the manufacturing process of the liquid crystal display panel, contaminants in the pixel region or film-layer residues 2 as shown in FIG. 2 may occur due to tiny dusts, which results in a short-circuit between the pixel electrode 1 and the data line 4, thereby the voltage on the pixel electrode 1 is not controlled by the TFT switch, the voltage is equal to the voltage on the data line 4, and therefore the display is not synchronized with the pixel therearound, which causes displaying defects (usually shown as bright points under a gray-scale image).

However, since the voltage of the data line 4 is relatively low, there is no significant difference between the voltage of the pixel electrode 1 and that of other pixel electrodes therearound, which results in the gray-scaled displaying of the liquid crystal display panel without difference, and thus the bright point cannot be detected effectively.

SUMMARY

In view of this, the major object of the embodiment of the present invention is to provide a method for detecting a bright point in the liquid crystal display panel, so as to realize the bright point detecting under the black image.

To achieve the above object, the technical solution of the embodiment of the present invention is achieved as: a method for detecting a bright point in a liquid crystal display panel, comprising applying a cutoff voltage to a gate of the liquid crystal display panel, remaining a thin film transistor TFT switch turning off; and applying a voltage higher than the voltage of a common electrode to a data line; detecting a bright point under the black image based on the voltages applied to the gate and the data line.

The process of detecting the bright point under the black image comprising a short circuit occurring between a pixel electrode and the data line, the voltage of the pixel electrode being higher than the voltages of other pixel electrodes around the pixel electrode, which makes the electric field between the pixel electrode and the common electrode relatively strong, and thus the liquid crystal is deflected, and the pixel is brighter than other pixels, which causes a bright point under the black image.

The method may be used for the liquid crystal display panel in the normally black mode.

The cutoff voltage is between −5V∼−15V in above technical solution.

BRIEF DESCRIPTION OF THE DRAWINGS

In order to illustrate the technical solution of the embodiments of the invention more clearly, the drawings of the embodiments will be briefly described below; it is obvious that the drawings as described below are only related to some embodiments of the invention, and thus are not limitative of the invention.

DETAILED DESCRIPTION

The technical solutions of the embodiments of the invention will be described in a clearly and fully understandable way in connection with the drawings related to the embodiments of the invention. It is obvious that the described embodiments are just a part but not all of the embodiments of the invention. According to the embodiments of the invention, all other embodiments obtained by those ordinary skilled in the art under the premise of without creative efforts are all intend to be within the scope of the invention.

Unless otherwise defined, the technical or scientific terms used herein shall have the general meanings understandable for those ordinarily skilled in the field of the present invention. "First", "second" and the like used in specification and claims of the patent application of the present invention do not show any order, number or importance, but are only used to distinguish different constituent parts. Likewise, the words such as "a", "an", "the" or similar shall not represent limitation of numbers, but mean existence of at least one. The phrases such as "include", "comprise" or similar intend to mean the elements or objects before such words cover or are equivalent to the elements or objects listed after such words, but other elements or objects are not exclusive. The phrases such as "connect", "connected" or similar are not limited to physical or chemical connection, but also include electrical connection, no matter directly or indirectly. The phrases such as "upper", "lower", "left", "right" and etc. shall be used only to represent relative positions, wherein when the absolute position of the described object is changed, the relative positions may be changed accordingly.

Figure 1:
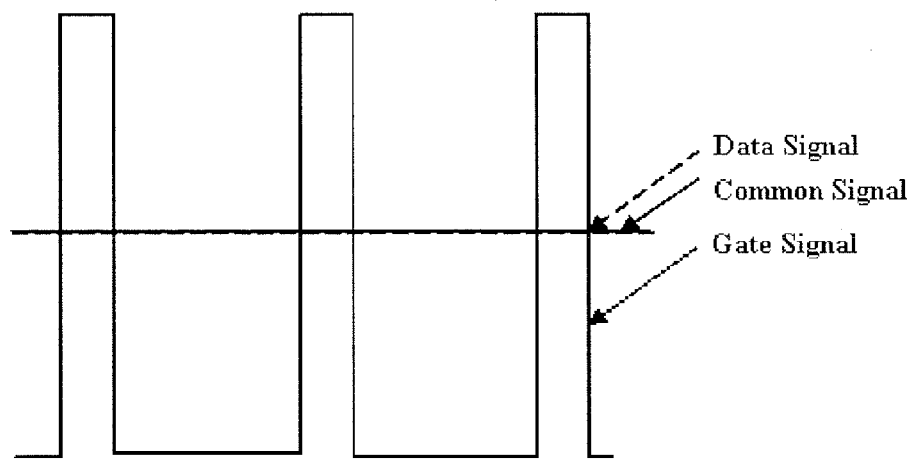
FIG. 1 is a schematic of the signal of the black image in the prior art.
Figure 2:
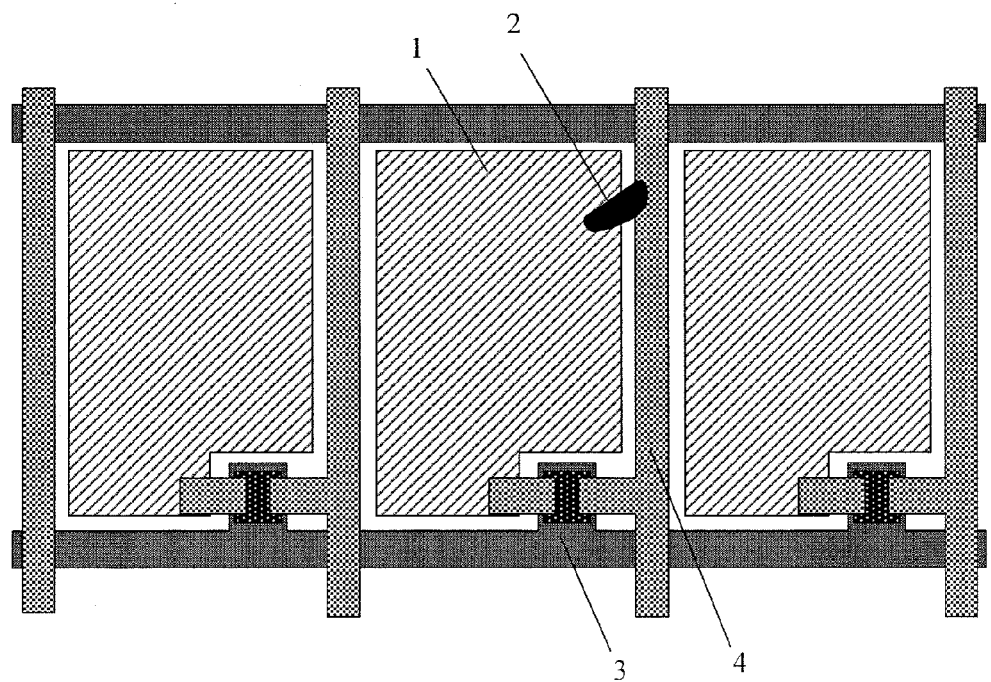
FIG. 2 is a principle schematic of the bright point formation in the prior art.
Figure 3:
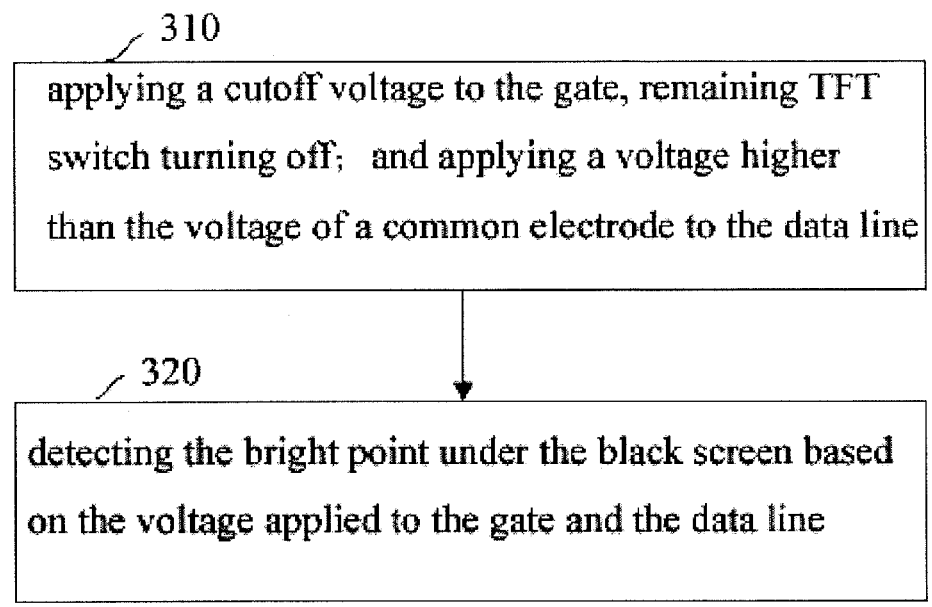
FIG. 3 is a flow chart of detecting the bright point according to an embodiment of the present invention.

In the actual practice, to the liquid crystal products such as a liquid crystal display panel in a normally black mode and the like, the core technical characteristics of the Advanced Super Dimension Switch (AD-SDS, referred to as ADS) are describing as follow: a multidimensional electric field is forming by the electric field generated by the edges of the slit electrode in the same plane and the electric field generated between the slit electrode layer and the plate-shaped electrode layer, which allows liquid crystal molecules in all orientations in a liquid crystal cell, which are located between the slit electrodes and directly above the electrodes, to be rotated, thereby enhancing the work efficiency of liquid crystals and increasing the light transmittance. The operations shown in FIG. 3 may comprises the steps as follow:

step 310: applying a cutoff voltage to the gate of the liquid crystal display, remaining the thin film transistor TFT switch turning off, and applying a voltage higher than the voltage of the common electrode to the data line:

step 320: detecting the bright point under the black image based on the voltage applied to the gate and the data line.

Figure 4:
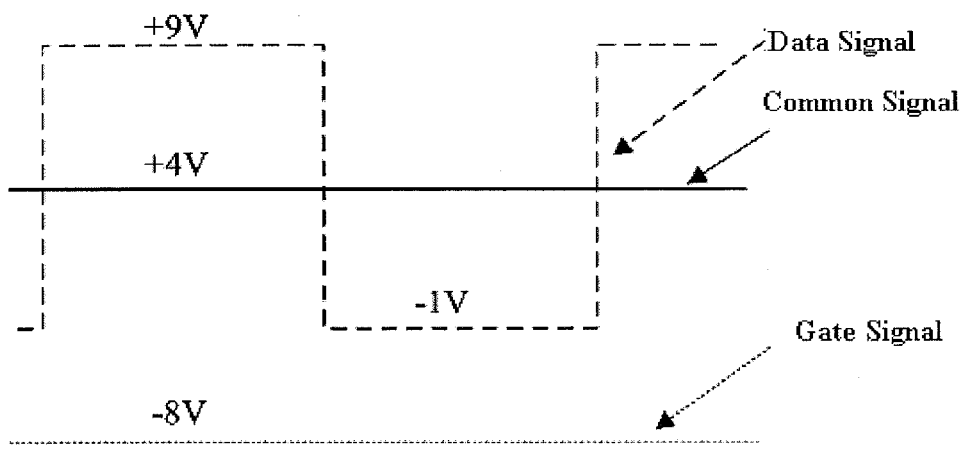
FIG. 4 is a principle schematic of detecting the bright point according to an embodiment of the present invention.

Specifically, the aforesaid operation can be illustrated as the principle shown in FIG. 4. For example, a higher voltage in view of the voltage of the common electrode can be applied to the data line; and a cutoff voltage (usually between −5V~−15V, such as −8V) is applied to the gate. At this time, the TFT switch is turned off. The electric field between the pixel electrode and the common electrode is weak, and the liquid crystal is not deflected, therefore the image of the liquid crystal display panel is black. If a pixel electrode is short-circuited with the data line, the voltage of the pixel electrode is higher than the voltages of other pixel electrodes around the pixel electrode since the voltage of the data line is relatively high in comparison with that of the common electrode, which makes the electric field between the pixel electrode and the common electrode strong, so that the liquid crystal is deflected. The pixel (herein "the pixel" and "the pixel electrode" represent different meanings, respectively. "The pixel electrode" represents the Indium tin oxide (ITO) electrode in the pixel, but "the pixel" represents the whole pixel, including the pixel electrode, color film substrate and the like) appears brighter than other pixels around, which results in the bright point under the black image, and therefore facilitates the detection of the bright point under the black image.

The previous descriptions are only preferred embodiments of the present invention. It is not intended to limit the scope of the present invention. It is apparent that various modifications and variations may be made by those skilled in the art without departing from the spirit and scope of the present invention. In this way, if these modifications and variations of the present invention fall in the scope of the claims and its equivalent technologies of this invention, it is intended that the present invention will include these modifications and variations.

What is claimed is:

1. A method for detecting a bright point in a liquid crystal display panel due to tiny dusts that results in a short-circuit between a pixel electrode and a data line, where a voltage on the pixel electrode is not controlled by a TFT switch and the voltage is equal to a voltage on the data line, comprising:

applying a cutoff voltage to a gate of the liquid crystal display panel, remaining a thin film transistor TFT switch turning off; applying a voltage higher than the voltage of a common electrode to a data line; and detecting a bright point under a black image based on the voltages applied to the gate and the data line, wherein the detecting the bright point under the black image comprises: a short-circuit occurring between a pixel electrode and the data line, the voltage of the pixel electrode is higher than the voltages of other pixel electrodes around the pixel electrode, which makes an electric field between the pixel electrode and the common electrode strong, thereby the liquid crystal is deflected, and the pixel is brighter than other pixels around the pixel, which results in the bright point under the black image.

2. The method according to claim 1, wherein the method is used for the liquid crystal display panel in the normally black mode.

3. The method according to claim 1, wherein the method is used for the liquid crystal display panel in the normally black mode.

4. The method according to claim 1, wherein the cutoff voltage is between −5V~−15V.

\* \* \* \* \*